United States Patent [19]
Hiroshima et al.

[11] 4,133,043
[45] Jan. 2, 1979

[54] SHIFT REGISTER TYPE MEMORY

[75] Inventors: Minoru Hiroshima, Mobara; Shigeru Yoshizawa, Tokorozawa; Nobuo Saito, Mitaka; Atsushi Asano, Kokubunji; Hiroshi Suehiro, Yokohama; Minoru Saitoh, Kawasaki; Keisuke Mise, Tokorozawa, all of Japan

[73] Assignees: Hitachi, Ltd.; Nippon Telegraph and Telephone Public Corporation, both of Japan

[21] Appl. No.: 853,276

[22] Filed: Nov. 21, 1977

[30] Foreign Application Priority Data

Dec. 3, 1976 [JP] Japan .................................. 51-144757

[51] Int. Cl.² ............................................. G11C 19/08
[52] U.S. Cl. ......................................... 365/15; 365/7
[58] Field of Search ........................................... 365/15

[56] References Cited
U.S. PATENT DOCUMENTS
3,838,407 9/1974 Juliussen .................................. 365/15

Primary Examiner—James W. Moffitt
Attorney, Agent, or Firm—Craig & Antonelli

[57] ABSTRACT

A shift register type memory having major and minor loops, wherein the number of bits of the major loop is large enough to permit data of at least two blocks to simultaneously exist in the major loop when one block is constituted of data of bits the number of which is equal to the number of the minor loops, and wherein before a particular block having been transferred out from the minor loops to the major loop is again transferred in to the minor loops after travelling round the major loop, the next block is transferred out from the minor loops to the major loop.

11 Claims, 8 Drawing Figures

SHIFT REGISTER TYPE MEMORY

BACKGROUND OF THE INVENTION

1. Field of the Invention

This invention relates to a shift register type memory. More particularly, it relates to a memory which employs a shift register type memory chip of the major-minor organization.

2. Description of the Prior Art

Typical memory chips of the shift register type are a magnetic bubble memory chip, a CCD (charge coupled device) memory chip, etc. In order to shorten the access time of a data, such shift register type memory chips adopt a known method of circuit arrangement which is called the major-minor organization.

Figure 1:
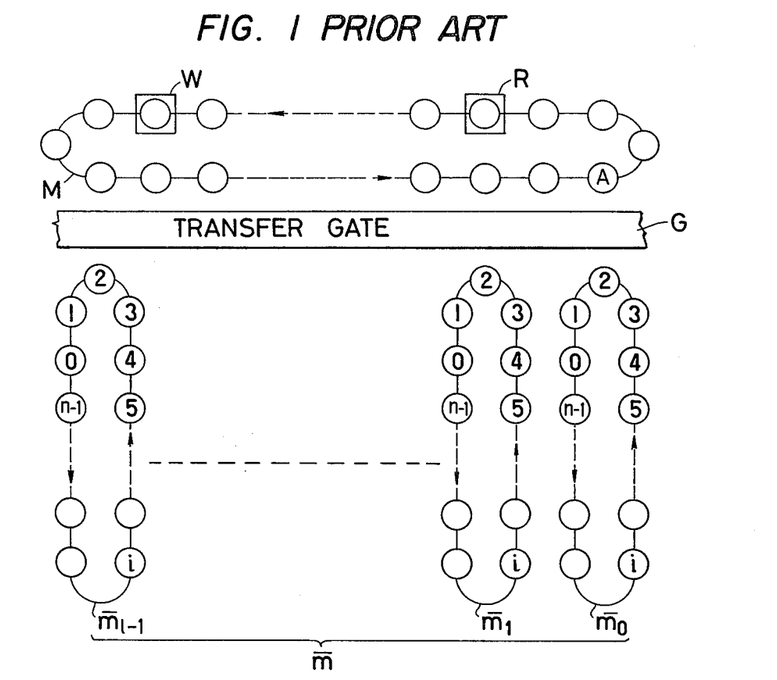
FIG. 1 is a diagram showing an example of the arrangement of a shift register type memory chip of the major-minor organization.

FIG. 1 shows an arrangement plan of a memory chip of the major-minor organization. In the figure, circles denote bit positions of shift registers, and arrows denote shift directions. Minor loops $\overline{m}$ include 1 closed-loop shift registers $\overline{m}_o - \overline{m}_{l-1}$ of loop Nos. 0, 1, 2, ..., j, ..., and l−1), and each loop consists of n bits. Data blocks are stored in the minor loops. A major loop M is made up of a single closed-loop shift register. The number of bits of the major loop M is assumed to be m. The data blocks are put in and out through the major loop. A transfer gate G is a circuit which couples the major loop with the minor loops so as to exchange the data block between both the loops. A "write" circuit W and a "read" circuit R are provided over the major loop.

The memory chip having such an arrangement retains the data blocks by adopting a data structure in which the respective bits of each data block are dispersed to and stored in the corresponding bit positions of the minor loops. Referring to FIG. 1, the bit positions ⓞ of the respective minor loops are places into which the data block of address O enters, the bit positions ① are places into which the data block of address 1 enters, ..., and the bit positions ⓘ are places into which the data block of address i enters. The leading bits of the respective data blocks enter into the minor loop No. 0, the first bits enter into the minor loop No. 1, ..., and the j-th bits enter into the minor loop No. j. Accordingly, the bit position ⓘ of the minor loop No. j receives the j-th bit of the data block of address i. The number B of bits constituting one data block is called the block length. In the case of FIG. 1, the number of the minor loops is l, and the number of bits of each loop is n. Therefore, n data blocks from address 0 to address (n−1), each of which has the block length B of l bits, can be stored. In case of the prior-art chips, the positional relationship of the addresses is illustrated in FIG. 1. That is, the bit position next to address 0 in each minor loop is address 1, the bit position next to address 1 is address 2, and so forth.

The memory chip adopting such a data structure conducts a memory operation as stated below. Now, let's consider a case of reading out the data block of address 2 (which shall hereinbelow be termed $D_2$, and similarly, the data block of address i shall be termed $D_i$) in FIG. 1. First, address 2 is shifted within each minor loop and is moved to an entrance and exit of the transfer gate. Subsequently, the transfer gate is operated to transfer the data block $D_2$ to the major loop (this operation is called "transfer out" which is abbreviated to $T_{out}$). The data block $D_2$ is shifted in the major loop. When the data block $D_2$ passes under the read circuit overlying the major loop, it is converted into an electric signal, which is transferred to the exterior. The shift of the data block $D_2$ in the major loop is continued. When the data block $D_2$ has travelled round the major loop and has come to entrances and exits of the transfer gate, the transfer gate is operated to return the data block $D_2$ to addresses 2 which are the original positions in the minor loops (this operation is called "transfer in" which is abbreviated to $T_{in}$). Thus, the "read" operation is completed.

The "write" operation for a data block is carried out similarly to the foregoing read operation. Now, consider a case of writing the data block into addresses 2. First, address 2 is shifted within each minor loop and is moved to the entrance and exit of the transfer gate. Subsequently, the old data block $D_2$ already existing in addresses 2 is transferred out to the major loop, and it is shifted in the major loop. When this data block $D_2$ passes under the write circuit overlying the major loop, the write circuit is operated to rewrite the old data block into the new one. When the new data block $D_2$ has come to the entrances and exits of the transfer gate, it is transferred in, and it is returned to addresses 2. Thus, the write operation is completed.

In the above memory operation, while the data block $D_2$ travels round the major loop, addresses 2 also move within the minor loops. Accordingly, in order that the data block $D_2$ having traveled round the major loop may return to the original addresses 2 just at $T_{in}$, the number of bits m of the major loop and the number of bits n of the minor loop may be held in the following relation:

$$n = m + 1 \tag{1}$$

The reason why n is greater by 1 than m is that ½ bit for each of $T_{in}$ and $T_{out}$, 1 bit in total, is required.

The memory chip of the major-minor organization is constructed and operated as thus far described.

In a memory employing such a shift register type memory chip of the major-minor organization, a case of successively reading or writing a series of data blocks extending over several successive addresses occurs frequently in the actual use. In such a case, the prior-art memory repeats one after another the read operation or the write operation of one data block as stated above. By way of example, in case where data blocks $D_1$ to $D_3$ of addresses 1 to 3 are to be read out, the data block $D_1$ of address 1 is read out; upon completion of this operation, the data block $D_2$ of address 2 is read out; and upon completion of this operation, the data block $D_3$ of address 3 is lastly read out. In this manner, after the read operation or the write operation of one data block has been completed, the operation for the data block of the next address is initiated. Therefore, at most one data block exists in the major loop, and two or more data blocks cannot exist simultaneously. As the result, a long gap of time G arises between one data block and the succeeding data block of the next address. On account of the long gap of time G, the data transfer rate is low in the prior-art memory.

Figure 2:
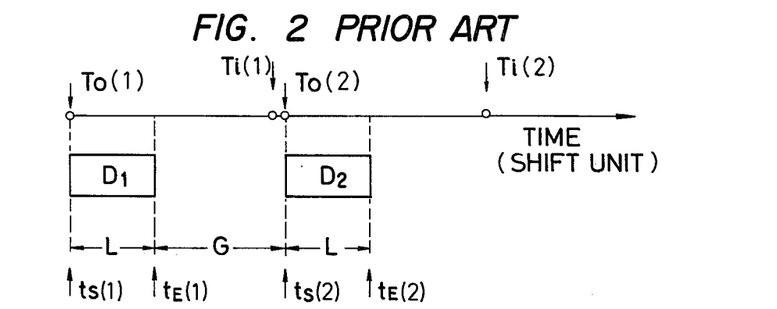
FIG. 2 shows an example of an operation diagram in a prior art in the case of successively processing a series of data blocks.

Here, let's consider the length of the gap G concretely as to the case of the memory chip in FIG. 1. FIG. 2 is an operation diagram in the case where two successive data blocks $D_1$ and $D_2$ in the memory chip of FIG. 1 are processed by the prior-art memory. The diagram has the time taken on the axis of abscissas, and indicates the points of time when the data blocks $D_1$ and $D_2$ are transferred out and transferred in and the points of time when they pass through a certain point A in the major loop. It is convenient that a period of time required for the data block to shift by 1 bit is used as the unit of time. Hereinafter, this unit shall be called the shift unit. FIG. 2 is also depicted with the shift unit. In the figure, $T_{out}$ is the point of time when the operation terminates, while $T_{in}$ is the point of time when the operation is initiated. It is convenient to choose as the point A in the major loop the point at which the minor loop No. 0 is coupled with the major loop (refer to FIG. 1), because in this case, the minor loop No. 0 stores the leading bits of the data blocks, and hence $T_{out}$ is at the same time the point of time when the leading bit of the data block begins to pass through the point A.

In FIG. 2, $T_{out}$ of the data block $D_1$ as represented by $T_o(1)$ is taken as 0 (zero). Then, $T_{in}$ of the data block $D_1$ as represented by $T_i(1)$ is equal to the number of bits m of the major loop. In general, the following relation holds between $T_{out}$ and $T_{in}$ of a certain data block $D_j$, that is, $T_o(j)$ and $T_i(j)$:

$$T_i(j) - T_o(j) = m \text{ (shift units)} \quad (2)$$

The point of time $t_S(1)$ when the leading bit of the data block $D_1$ starts passing through the point A agrees with the time $T_o(1)$, and hence, it is 0 (zero). The difference L between the point of time $t_S(j)$ when the leading bit of the data block $D_j$ starts passing through the point A and the point of time $t_E(j)$ when the last bit thereof ends passing through the point A shall be called the data block width. In FIG. 1, the number of the minor loops is l, and the respective minor loops are coupled with the major loop at intervals of 2 bits, so that the data block width L is given by:

$$L = 2 l - 1 \text{ (shift units)} \quad (3)$$

Accordingly, the point of time $t_E(1)$ when the last bit of the data block $D_1$ passes through the point A is $L + t_S(1) = L$. Between $T_{in}$ of the data block $D_1$ as represented by $T_{in}(1)$ and $T_{out}$ of the data block $D_2$ as represented by $T_o(2)$, the following relation holds:

$$T_o(2) - T_i(1) = 2 \text{ (shift units)} \quad (4)$$

The details of the value 2 are ½ shift unit for the $T_{in}$ operation of the data block $D_1$, 1 shift unit for the shift of the data block $D_2$ to the entrance and exit of the transfer gate, and ½ shift unit for the $T_{out}$ operation of the data block $D_2$. Accordingly, $T_{out}$ of the data block $D_2$ as represented by $T_o(2)$ is $m + 2$. After this point of time $T_o(2)$, quite the same operation as in the case of the data block $D_1$ is repeated. The length of the gap G between the data blocks $D_1$ and $D_2$ is given by:

$$G = t_S(2) - t_E(1) \text{ (shift units)} \quad (5)$$

This gap G is given by $(m - 2 - L)$. For example, in a case of a memory chip of 64 kilobits where $m = 516$ and $l = 128$, the gap G is a large value of 263.

As described above, in the case of successively processing the series of data blocks, the prior-art memory has the problem that the long time gap G arises between the two data blocks and that the data transfer rate is low on account of the gap G.

In order to eliminate the disadvantage, Japanese Patent Application Public-disclosure No. 51-44832 has proposed a major-minor organization in which data blocks are continuously transferred in or transferred out. The subject matter of the patent application for achieving such an object is that the product between the interval Δ(shift units) of the respectively adjacent bits of a major loop containing information (in the foregoing example, $\Delta = 2$) and the number of minor loops, and the number of bits n of the minor loop have no common factor therebetween. This is a condition for continuously reading or writing a plurality of blocks without any gap between the blocks. According to this organization, the data blocks can be transferred in or out within the number of blocks enterable in the major loop and without causing any gap between the blocks. It is impossible, however, to transfer out or in a plurality of data blocks one after another without any blank between the blocks while a data having been transferred out from the minor loops is being transferred into the minor loops again.

SUMMARY OF THE INVENTION

This invention has been made in order to solve the problems of the prior-art memories as described above, and has for its object to provide a memory in which a long time gap G does not arise between two data blocks in case of successively processing a series of data blocks.

The subject matter of this invention for accomplishing the above object is that a time gap G which is much smaller than a half of the number of bits m of a major loop but is larger than 1 is set between two successive data blocks.

Hereunder, this invention will be described more in detail in connection with embodiments with reference to the accompanying drawing.

BRIEF DESCRIPTION OF THE DRAWING

FIGS. 4 and 5 are diagrams of an embodiment of a memory chip according to this invention, in which

DESCRIPTION OF THE PREFERRED EMBODIMENTS

Figure 3:
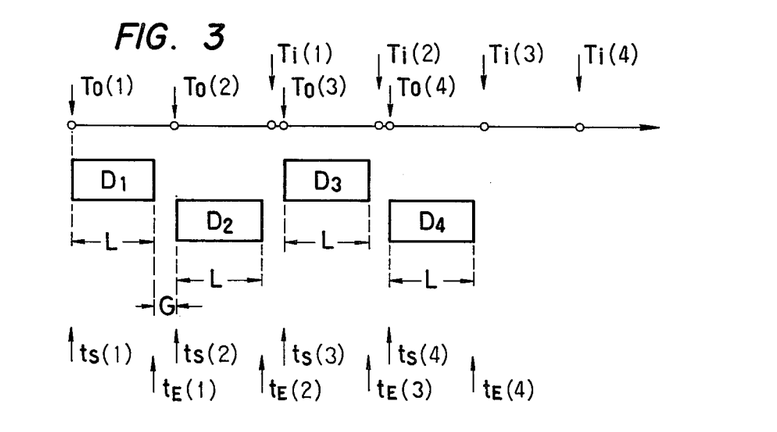
FIG. 3 shows an example of an operation diagram according to this invention in the same case.

FIG. 3 shows an example of an operation diagram in the case of successively processing a series of data blocks with the memory of this invention. The figure is depicted in the same form as in FIG. 2 by taking as an example a case of processing for successive data blocks $D_1$ to $D_4$ of addresses 1 to 4. A merit of this invention is that, by way of example, before transferring in the data block $D_1$, the data block $D_2$ is transferred out as illustrated in FIG. 3. That is, the following relation holds:

$$T_i(j) > T_o(j+1) \qquad (6)$$

In the case of this invention, accordingly, the two data blocks $D_1$ and $D_2$ coexist in the major loop during the period between $T_o(2)$ and $T_i(1)$.

Now, let's consider a memory chip in the case of performing this invention. There will be described an embodiment of a memory chip in the case where this invention is applied to the shift register type memory chip of the major-minor organization.

(1) Order of array of addresses within the minor loop:

In the memory chip in which this invention is performed, the array of addresses within the minor loop is different from that in the prior art described with reference to FIG. 1. The addresses need to be arrayed so that, for example, address 2 may come to the entrance and exit position of the transfer gate at the point of time $T_o(2)$ in FIG. 3. With the array of addresses in FIG. 1, the point of time when address 2 comes to the entrance and exit position of the transfer gate is $T_o(3)$ in FIG. 3, and hence this invention cannot be performed.

Figure 4:
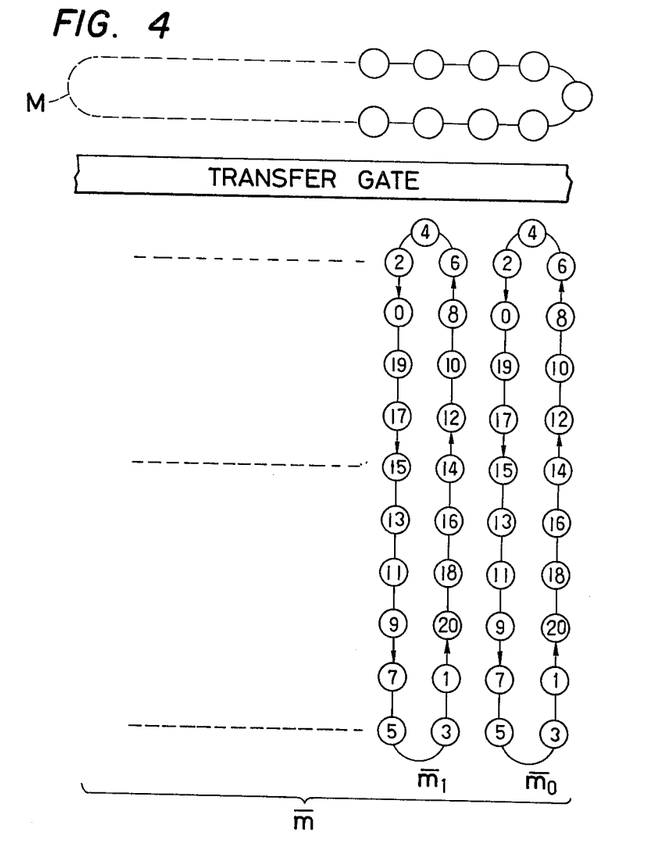
FIG. 4 shows an example of the order of array of addresses according to this invention and FIG. 5 shows a state of the coexistence of a plurality of data blocks in a major loop.

An example of the order of array of addresses of the memory chip to which this invention is applied is shown in FIG. 4. The figure exemplifies a case where the number of bits n of each minor loop is 21. Even addresses succeed up to address 20 in order in such a manner that address 2 adjoins address 0 and that address 4 adjoins address 2. Odd addresses succeed up to address 19 in order in such a manner that address 1 which is the head address of the odd addresses adjoins address 20 which is the final address of the even addresses, that address 3 adjoins address 1 and that address 5 adjoins address 3. Although only n = 21 is illustrated in the case of FIG. 4, a similar order of array of addresses is established for the general values of n. That is, even addresses are firstly arrayed in succession, and are followed by odd addresses arrayed in succession.

(2) Input/output of the data blocks at equal intervals:

When viewed from the memory side, it is an important requirement that a series of data blocks can be read or written at equal intervlls. In order to satisfy this requirement of equal intervals, the following may be held in FIG. 3:

$$T_o(j+1) - T_o(j) = K \text{ (constant)}$$

or $$T_i(j+1) - T_i(j) = K \text{ (constant)} \qquad (7)$$

where $$j = 1, 2, \ldots$$

Now, letting m denote the number of bits of the major loop and n denote the number of bits of each minor loop, the number K will be evaluated. Eqs. (1), (2) and (3) hold good quite similarly in the case of this invention described with reference to FIG. 3. Eq. (4) can be represented as follows in the case of FIG. 3:

$$T_o(j+2) - T_i(j) = 2 \qquad (8)$$

where $$j = 1, 2, \ldots.$$

In FIG. 3, accordingly,

| | |
|---|---|
| from Eq. (1), | $n = m + 1$ |
| from Eq. (2), | $T_i(1) - T_o(1) = m$ |
| from Eq. (8), | $T_o(3) - T_i(1) = 2$ |
| and from Eq. (7), | $T_o(3) - T_o(1) = 2 K$ |

When K is evaluated in terms of n or m, $$K = (n + 1)/2 = (m + 2)/2 \qquad (9)$$

K should be an integer. It is, accordingly, necessary that the number of bits n of each minor loop is odd and the number of bits m of the major loop is even. The value of the constant K is equal to the interval between address 1 and address 2 in the order of array of addresses stated above. That is, address 2 should be placed at the K-th bit as reckoned from address 1. Also the example shown in FIG. 4 has an address array which fulfills this relation.

Figure 5:
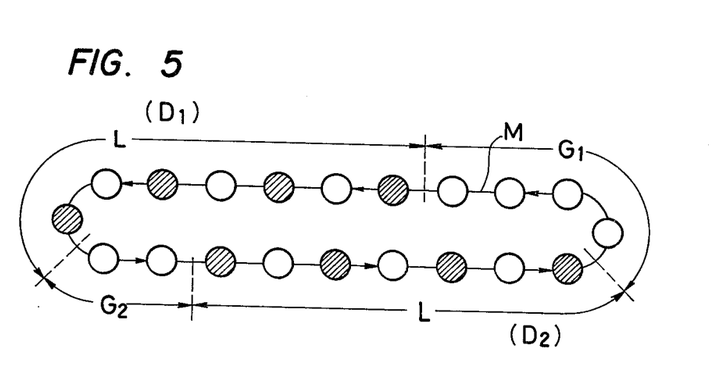

(3) Condition for coexistence of two data blocks without overlapping in the major loop:

In the memory chip to which this invention is applied, two data blocks sometimes exist in the major loop at the same time. In this case, the two data blocks must not overlap in the major loop. Now, let's consider a case where the two data blocks $D_1$ and $D_2$ exist in the major loop as shown in FIG. 5. In the figure, hatched circles indicate the respective bits of the data blocks $D_1$ and $D_2$. Letting $l$ denote the number of minor loops, the number of the hatched circles in each of the data blocks $D_1$ and $D_2$ is l, and the data block width L is equal to $(2l - 1)$ from Eq. (3). As indicated in the figure, let $G_1$ represent the gap between the last bit of the data block $D_1$ and the leading bit of the data block $D_2$, and $G_2$ represent the gap between the leading bit of the data block $D_1$ and the last bit of the data block $D_2$. In this case, the gap $G_1$ corresponds to the gap G previously stated in Eq. (5). A condition for preventing the data blocks $D_1$ and $D_2$ from overlapping is:

$$G_1, G_2 > 0$$

As apparent from FIG. 5, the following holds:

$$2L + G_1 + G_2 = m \qquad (10)$$

where m denotes the number of bits of the major loop. The value K of Eq. (9) previously stated has the following relation:

$$L + G_1 = K \qquad (11)$$

By eliminating K, L and m from Eqs. (9)–(11), the following is obtained:

$$G_1 = G_2 + 2 \qquad (12)$$

Now consider a case where m = 516 and l = 128 by taking a chip of 64 kilobits as an example. Then, $G_1 = 4$ is obtained in Eq. (12). This value is much smaller than the value 263 of the gap G in the prior art stated in Eq. (5) for the same case. As the result, according to this invention, the data transfer rate can be twice as high as that in the prior art.

Figure 6:
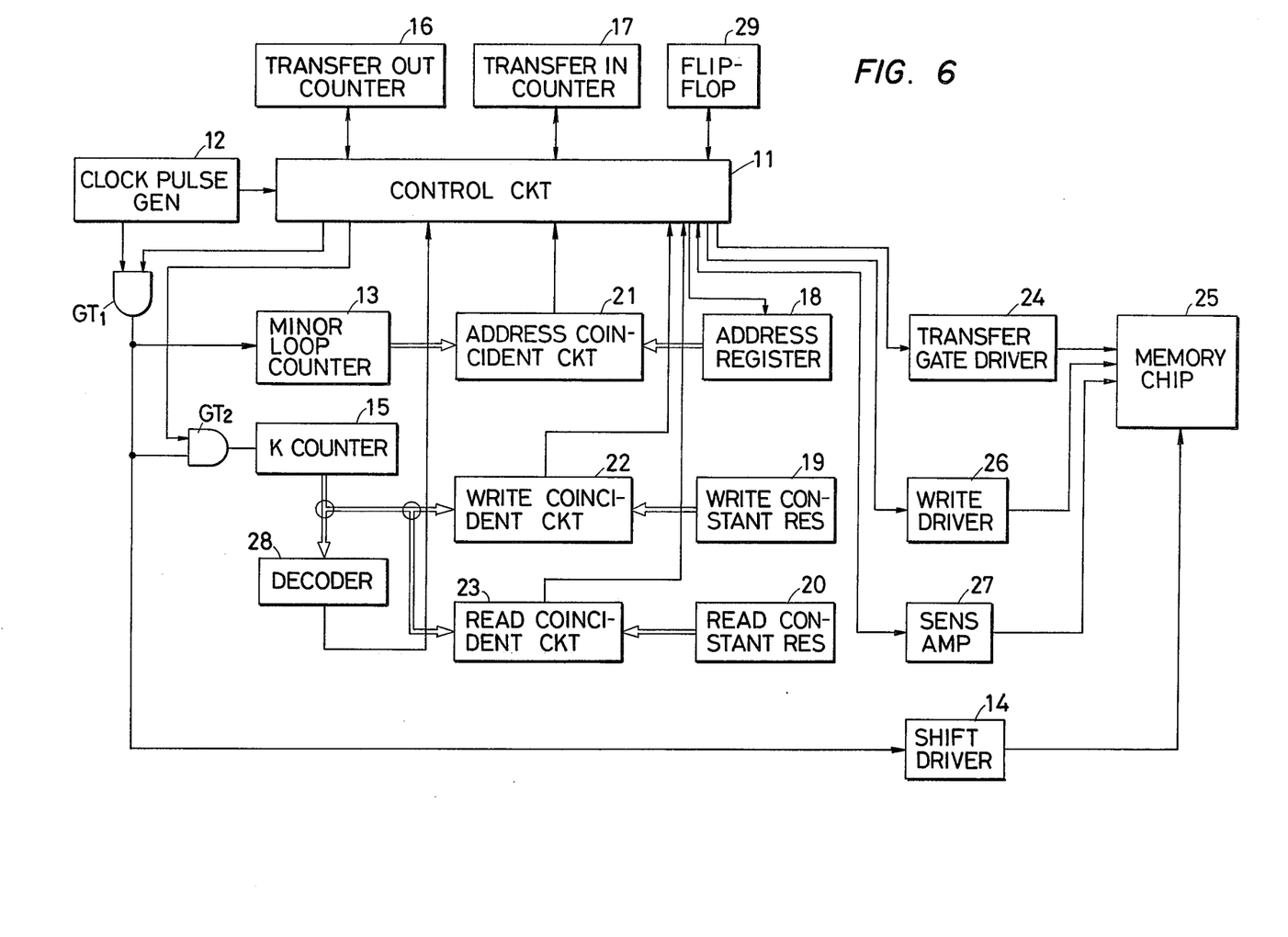
FIG. 6 shows an example of a block diagram of a memory embodying this invention.

Description will now be made of electronic circuitry for performing the memory of this invention. FIG. 6 shows an example of a block diagram of the memory according to this invention. In the figure, numeral 11 designates a control circuit for controlling the whole device, and numeral 12 a clock pulse generator. Shown at 13 is a minor loop counter. It is a binary counter whose content changes in correspondence with the address of a data block which lies at the entrance and exit positions of a transfer gate in a memory chip. Accordingly, the period of the minor loop counter 13 is the number of bits n of each minor loop. The change of the content of the minor loop counter 13 is done in synchronism with a shift driver 14 to be described later. Numeral 15 designates a binary counter whose period is the value K stated in Eq. (9) (this value is also equal to the interval between address 1 and address 2 stated with reference to FIG. 4, that is, the length of 1 cycle) and which shall be termed the K counter. The K counter counts the number of times of shift operations in synchronism with the shift driver 14 from the point of time immediately after the data block in the memory chip has been transferred out to the major loop. Numeral 16 denotes a counter for storing the number of a series of data blocks to be successively processed. It is a down counter whose content decreases by one each time one data block is transferred out to the major loop, and it shall be called the transfer out counter (abbreviated to TO counter). Consequently, the content of the TO counter 16 represents the number of the remaining data blocks to be transferred out henceforth. Likewise, a counter 17 stores the number of remaining data blocks to be transferred in henceforth. It is a down counter whose content decreases by one each time one data block having been processed in transferred in to the minor loops, and it shall be called the transfer in counter (abbreviated to TI counter).

Numeral 18 indicates an address register, which stores the address of a data block to be subsequently processed. Numeral 19 indicates a write constant register for storing a certain constant value. It serves to prescribe the operating timing of the write circuit of the memory chip described with reference to FIG. 1. Likewise, a read constant register 20 serves to prescribe the operating timing of the read circuit of the memory chip. Shown at 21 is an address coincidence circuit which compares the content of the minor loop counter 13 and that of the address register 18 and which, when the two contents coincide, detects the coincidence and transmits a coincidence signal to the control circuit 11. The time when the coincidence is established is the point of time at which the data block appointed by the address register 18 is transferred out to the major loop. Likewise, a write coincidence circuit 22 compares the content of the K counter 15 and that of the write constant register 19, and detects the coincidence therebetween. The time when the coincidence is detected is the point of time at which the operation of the write circuit of the memory chip is started. A read coincidence circuit 23 compares the content of the K counter 15 and that of the read constant register 20, and detects the coincidence therebetween. The time when the coincidence is detected is the point of time at which the operation of the read circuit of the memory chip is started.

Numeral 24 designates a transfer gate driver for driving the transfer gate of the memory chip 25, numeral 26 a write driver for driving the write circuit of the memory chip, and numeral 27 a sense amplifier for processing the output of the read circuit of the memory chip. The shift driver 14 referred to earlier is a circuit which shifts the data block or the address in the memory chip bit by bit.

$GT_1$ and $GT_2$ indicate AND gates, at which clock pulses from the clock pulse generator 12 are controlled by the control circuit 11. The output of the AND gate $GT_1$ enters the minor loop counter 13 and the shift driver 14. Each time one clock pulse is provided from the output of the AND gate $GT_1$, the shift driver 14 shifts the data block within the memory chip by 1 bit, and the minor loop counter 13 counts up its content by one. As previously referred to, the shift driver 14 and the minor loop counter 13 are synchronously operated by the output of the AND gate $GT_1$. The output of the AND gate $GT_2$ enters the K counter 15. Each time one clock pulse is delivered from the output of the AND gate $GT_2$, the K counter 15 counts up its content by one.

Shown at 28 is a decoder circuit, which detects the time at which the content of the K counter 15 becomes $(K-2)$. The time when $(K-2)$ is reached is the point of time at which the data block in the major loop is transferred in and is returned to the minor loops. Here, K represents the value stated in Eq. (9). Numeral 29 designates a flip-flop, which is set to "1" when the content of the K counter 15 returns from $(K-1)$ to zero with the period which is K. Once the flip-flop 29 is set, it keeps the state "1" until the successive processings of the series of data blocks terminate. As stated below, it prescribes the point of time of the transfer in. As indicated in FIG. 3, the first transfer-in operation $T_i(1)$ is executed after the second transfer-out operation $T_o(2)$. The subsequent transfer-in operations are carried out every K-bit shift as given in Eq. (7). It is accordingly necessary to distinguish between the first output time and the second and subsequent output times of the decoder 28 indicating the transfer-in times, and to conduct the transfer-in operations at the second and subsequent output times. The flip-flop 29 functions to make a distinction between the first output time and the second and subsequent output times. In consequence, the transfer-in operation is done when the flip-flop 29 is in the state "1" and the decoder 28 provides the detection output.

In the memory of such a construction, the processings of the series of data blocks as described with reference to FIG. 3 are performed as stated below.

Now, let's consider a case of reading out four data blocks $D_1$–$D_4$ of addresses 1 to 4. Upon receipt of such a request, the control circuit 11 resets the K counter 15 and the flip-flop 29 and makes their contents zero. It also sets 4, which is the number of the data blocks to be successively processed, in the TO counter 16 and the TI counter 17, and sets 1, which is the head address among the addresses of the data blocks, in the address register 18.

After completion of these preparatory operations, the control circuit 11 enables the AND gate $GT_1$ to transmit the clock pulses from the clock pulse generator 12 to the minor loop counter 13 and the shift driver 14. The minor loop counter 13 counts up the clock pulses, while the shift driver 14 shifts the data blocks bit by bit. When the content of the minor loop counter 13 and that of the address register 18 coincide, the address coincidence circuit 21 transmits the coincidence signal to the control circuit 11. As soon as the control circuit 11 receives the coincidence signal, it operates the transfer gate driver 24 so as to transfer out the data block $D_1$. This point of time corresponds to $T_o(1)$ in FIG. 3. Simultaneously therewith, the control circuit 11 opens the AND gate $GT_2$ so that the clock pulses may also enter the K counter 15. In addition, the control circuit 11 decreases the content to the TO counter 16 by one, that is, changes it from 4 to 3, and increases the content of the address register 18 by one, that is, makes it 2, which is the address in which the next data block $D_2$ is contained.

The K counter 15 counts up the clock pulse each time it is received. When the content of the K counter 15 coincides with the content of the read constant register 20, the read coincidence circuit 23 transmits the coincidence signal to the control circuit 11. Upon receipt of this coincidence signal, the control circuit 11 drives the sense amplifier 27 so as to start the reading of the data blcok $D_1$. When the content of the K counter 15 increases and becomes $(K-2)$, the decoder 28 transmits the coincidence signal to the control circuit 11. Upon receipt of this signal, the control circuit 11 executes the transfer-in operation. In the present case, however, the content of the flip-flop 29 is "0". Therefore, the operation is not conducted, and the flip-flop 29 is set to "1" instead so that the transfer-in operations may be carried out from the next time.

Meanwhile, the content of the minor loop counter 13 becomes 2 and coincides with the content of the address register 18. Then, the address coincidence circuit 21 transmits the second coincidence signal to the control circuit 11. Upon receipt of this signal, the control circuit 11 conducts the same operation as in the case of the first time. That is, it operates the transfer gate driver 24 to transfer out the second data block $D_2$. This point of time corresponds to the point of time $T_o(2)$ in FIG. 3. Besides, the control circuit 11 decreases the content of the TO counter 16 by one, that is, changes it from 3 to 2, and increases the content of the address register 18 by one, that is, makes it 3 which is the address in which the next data block $D_3$ is contained. Since the AND gate $GT_2$ has been already opened at the preceding time, it need not be opened from this time on.

When the content of the K counter 15 coincides with that of the read constant register 20 again with the period which is K, the read coincidence circuit 23 transmits the second coincidence signal to the control circuit 11. Upon receipt of this coincidence signal, the control circuit 11 carries out the same operation as in the case of the first time. That is, it drives the sense amplifier 27 so as to start the reading of the second data block $D_2$.

When the content of the K counter 15 increases and becomes $(K-2)$ again, the decoder 28 transmits the second coincidence signal to the control circuit 11. Since the flip-flop 29 has been already set to "1" at the preceding time, the control circuit 11 operates the transfer gate driver 24 so as to transfer in the first data block $D_1$. This point of time corresponds to the point of time $T_i(1)$ in FIG. 3. Simultaneously therewith, the control circuit 11 decreases the content of the TI counter 17 by one, that is, changes it from 4 to 3.

When the content of the minor loop counter 13 becomes 3 and coincides with the content of the address register 18, the address coincidence circuit 21 transmits the third coincidence signal to the control circuit 11. Upon receipt of this coincidence signal, the control circuit 11 conducts quite the same operation as in the case of the second time, to transfer out the data block $D_3$, to increase the content of the address register 18 by one, that is, make it 4 which is the address in which the next data block $D_4$ is contained, and to decrease the content of the TO counter 16 by one, that is, change it from 2 to 1. This point of time corresponds to $T_o(3)$ in FIG. 3.

When the content of the K counter 15 becomes coincident with that of the read constant register 20 again, the read coincidence circuit 23 transmits the third coincidence signal to the control circuit 11. The control circuit 11 having received this signal conducts quite the same operation as in the case of the second time, to start the read operation for the third data block $D_3$.

When the content of the K counter 15 becomes $(K-2)$ again, the decoder 28 transmits the third coincidence signal to the control circuit 11. Upon receipt of this signal, the control circuit 11 carries out quite the same operation as in the case of the second time, to transfer in the data block $D_2$ and to decrease the content of the TI counter 17 by one, that is, change it from 3 to 2. This point of time corresponds to $T_i(2)$ in FIG. 3.

When the content of the minor loop counter 13 becomes 4 and coincides with the content of the address register 18, the address coincidence circuit 21 transmits the fourth coincidence signal to the control circuit 11. Upon receipt of this signal, the control circuit 11 transfers out the data block $D_4$. This point of time corresponds to $T_o(4)$ in FIG. 3. Simultaneously therewith, the control circuit 11 decreases the content of the TO counter 16 by one, that is, changes it from 1 to zero. Each time the control circuit 11 decreases the content of the TO counter 16 by one, it checks if the content is zero. When the content becomes zero as in the present case, all the requested data blocks $D_1$-$D_4$ have been transferred out, and the control circuit 11 ignores the subsequent coincidence signals from the address coincidence circuit 21. The operation of increasing the content of the address register 18 by one need not be done, either.

When the content of the K counter 15 coincides with that of the read constant register 20, the read coincidence circuit 23 transmits the fourth coincidence signal to the control circuit 11. Upon receipt of this signal, the control circuit 11 starts the read operation for the data block $D_4$. The control circuit 11 stores the fact that the content of the TO counter 16 has become zero some time ago, regards the present data block $D_4$ as being the final data block, and ignores the subsequent coincidence signals from the read coincidence circuit 23.

When the content of the K counter 15 becomes $(K-2)$, the decoder 28 transmits the fourth coincidence signal to the control circuit 11. Upon receipt of this signal, the control circuit 11 carries out quite the same operation as in the case of the third time, to transfer in the data block $D_3$ and to decrease the content of the TI counter 17 by one, that is, change it from 2 to 1. This point of time corresponds to $T_i(3)$ in FIG. 3.

For the reason stated previously, the control circuit 11 ignores the fifth coincidence signals which are transmitted from the address coincidence circuit 21 and the read coincidence circuit 23.

When the content of the K counter 15 becomes $(K-2)$ and the fifth coincidence signal is transmitted from the decoder 28, the control circuit 11 transfers in the data block $D_4$. This point of time corresponds to $T_i(4)$ in FIG. 3. Simultaneously therewith, the content of the TI counter 17 is decreased by one so as to change from 1 to zero. As in the case of the TO counter 16, the control circuit 11 checks if the content of the TI counter 17 is zero, each time the content is decreased by one. When the content becomes zero as in the present case, all the requested data blocks $D_1$-$D_4$ have been transferred in, and the control circuit 11 closes the gate circuits $GT_1$ and $GT_2$ so as to stop the clock pulses which have been fed to the minor loop counter 13, the K counter 15 and the shift driver 14 till then. Thus, it stops the count-up operation of the minor loop counter 13 and the shift operation of the shift driver 14.

The successive read operations of the four data blocks $D_1$–$D_4$ of addresses 1 to 4 have now been completed.

To successively write a series of data blocks can be executed quite similarly to the foregoing case of reading. A difference is as will be described hereunder with reference to FIG. 6. In the case of reading, when the coincidence signal is transmitted from the read coincidence circuit 23, the control circuit 11 drives the sense amplifier 27 to start the read operation. In contrast, in the case of the write operation, when the coincidence signal is transmitted from the write coincidence circuit 22, the control circuit 11 drives the write driver 26 to start the write operation. Only this point is the difference between the two cases.

Now, there will be explained examples of the minor loop counter 13, the address register 18 and the address coincidence circuit 21 in FIG. 6 embodying this invention.

In the embodiment of the memory chip of this invention, the order of array of addresses is such that, as exemplified in FIG. 4, the even addresses succeed as address 0, address 2, . . . , after which the odd addresses succeed as address 1, address 3, . . . On the other hand, in the prior-art memory chip, the addresses are arrayed as address 0, address 1, address 2, . . . as described with reference to FIG. 1. In the case of this invention, therefore, the minor loop counter 13, the address register 18 and the address coincidence circuit 21 become different in construction from those in the case of the prior art.

Figure 7:
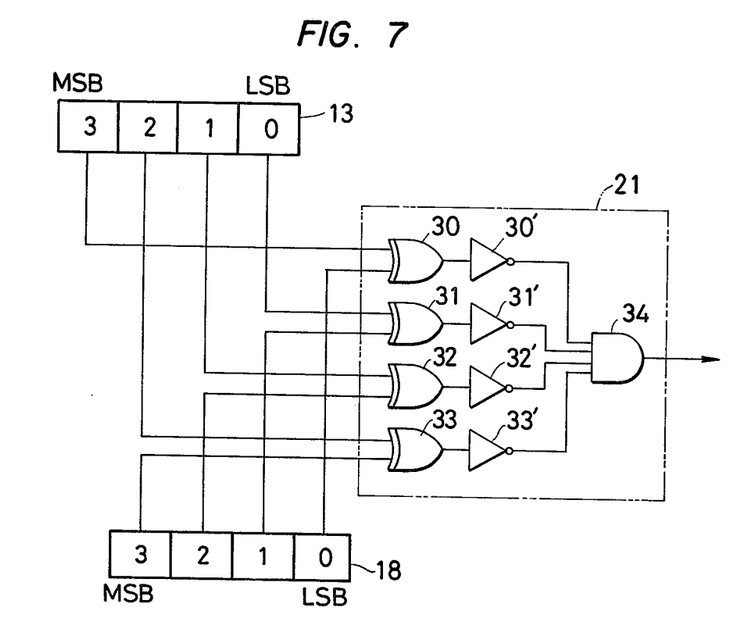
FIG. 7 shows a minor loop counter, an address register and a coincidence circuit embodying this invention.

FIG. 7 shows the examples of the minor loop counter 13, the address register 18 and the address coincidence circuit 21 embodying this invention. In the illustrated embodiment, the minor loop counter 13 and the address register 18 are constructred of circuits of 4 bits. In the figure, LSB represents the least significant bit position, i.e., the 0-th bit position, while MSB represents the most significant bit position, i.e., the third bit position in the present case. Constituents 30, 31, 32 and 33 of the address coincidence circuit 21 are exclusive OR gates, constituents 30', 31', 32' and 33' are inverters, and a constituent 34 is an AND gate. When two inputs entering the exclusive OR gate 30 coincide, an output from the inverter 30' is "1". Quite the same applies to two inputs entering each of the other exclusive OR gates 31, 32 and 33, and when the inputs coincide, an output from the corresponding inverter 31', 32' or 33' is "1". When the input pairs coincide, an output from the AND gate 34 is "1". This output of the AND gate 34 corresponds to the coincidence signal of the address coincidence circuit 21 as described with reference to FIG. 6. In the embodiment of FIG. 7, the third bit (MSB) of the minor loop counter 13 and the 0-th bit of the address register are brought for the comparison to the inputs of the exclusive OR gate 30. Likewise, the 0-th bit (LSB) of the minor loop counter 13 and the first bit of the address register 18 are brought for the comparison to the inputs of the exclusive OR gate 31, the first bit of the minor loop counter 13 and the second bit of the address register 18 are brought for the comparison to the inputs of the exclusive OR gate 32, and the second bit of the minor loop counter 13 and the third bit (MSB) of the address register 18 are brought for the comparison to the inputs of the exclusive OR gate 33. By taking such comparisons, a conventional binary counter can be employed as the minor loop counter 13 conveniently.

Figure 8:
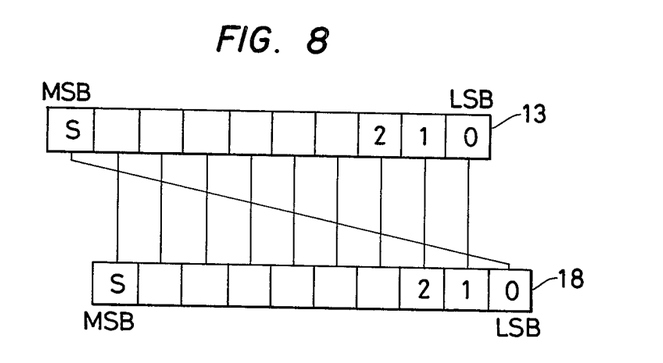
FIG. 8 shows a generalized diagram corresponding to FIG. 7.

Although FIG. 7 exemplifies the case of 4 bits, the circuits can be constructed quite similarly in general cases. FIG. 8 shows the way of making comparisons of the respective bits of the minor loop counter 13 and the address register 18 in the case of (S + 1) bits. The bits coupled by a line are compared with each other. By making such comparisons, the minor loop counter may be a conventional binary counter.

The above is the description of the successive processings of a series of data blocks according to this invention. As set forth above, in accordance with this invention, the time gap which arises between two successive data blocks is short, and the data transfer rate can be made approximately twice as high as that in the prior art.

The embodiment of the memory in FIG. 6 merely illustrates an example according to this invention, and the invention is quite similarly applicable to the other devices having similar functions. Although, in the foregoing description, the case of the coexistence of two data blocks in the major loop has been taken as an example, this invention is quite similarly applicable to a case where three or more data blocks are caused to coexist.

What is claimed is:

1. A shift register type memory, comprising;
   a plurality of minor loops each of which has a plurality of bits,
   a major loop which is large enough to permit data of at least two blocks to simultaneously exist therein when data of one block from said minor loops are constructed of the same number of bits as the number of said minor loops,
   means for controlling transfer of the data between said major loop and said minor loops,
   means for generating first timing signals for transferring out a plurality of blocks into said major loop sequentially and successively at time intervals shorter than a period of time required for the data to travel round said major loop, and
   means for generating a second timing signal for transferring in the data having been already transferred out to said major loop by said first timing signal, to predetermined positions within said minor loops at a point of time between timings of the successive transfer-out operations.

2. A shift register type memory according to claim 1, wherein the number of blocks simultaneously existing in said major loop is two.

3. A shift register type memory according to claim 1, wherein the number of bits within said each minor loop is odd, and the number of bits within said major loop is even.

4. A shift register type memory according to claim 1, wherein intervals of generating said first timing signals for the transfer-out are constant irrespective of the blocks.

5. A shift register type memory according to claim 1, wherein the means for generating said first and second timing signals comprise:
   an address register which stores an address of a head block among the plurality of blocks to be successively transferred out, an address counter which counts an address of the data block within said minor loops as lies at exits of a transfer gate within said minor loops, means for comparing the values of said address register and said address counter, means for generating, when said values coincide as the result of the comparison, a first timing for transferring out the data from said minor loops to said major loop, a K counter which is driven in synchronism which shift clocks of said minor loops, which is reset each time said first timing signal is generated, and whose period is a difference between addresses of the successive blocks within said minor loops, and a circuit which generates, when the value of said counter becomes a predetermined value smaller than said difference between addresses of the successive blocks within said minor loops, a second timing for transferring in the data from said major loop to said minor loops.

6. A shift register type memory according to claim 5, wherein after the first transfer-out, said address register sequentially stores addresses within said minor loops, of blocks to be subsequently transferred out, and when said values of said address register and said address counter coincide as the result of the comparison, the first timings for transferring out the subsequent blocks are sequentially generated.

7. A shift register type memory according to claim 5, wherein said means for comparing the values of said address register and said address counter comprises a coincidence circuit for output signals of an $\alpha$-th bit of said address counter and an $(\alpha+1)$-th bit of said address register, a coincidence circuit for output signals of a most significant bit of said address counter and a least significant bit of said address register, and an AND circuit into which outputs of all the coincidence circuits at such respective bits are entered.

8. A shift register type memory according to claim 5, wherein said circuit which generates said second timing generates said second timing only when the number of times by which a value of said K counter has become said predetermined value smaller than said difference between addresses of the successive blocks within said minor loops is greater than a predetermined number.

9. A shift register type memory according to claim 8, wherein said predetermined value smaller than said difference between addresses of the successive blocks within said minor loops is selected to a number which is smaller than said difference by 2.

10. A shift register type memory according to claim 1, wherein the total number n of bits within said each minor loop is odd, and addresses of the respective bits are $0, 2, 4, \ldots, n-1, 1, 3, 5, \ldots,$ and $n-2$ in sequence.

11. A shift register type memory according to claim 1, wherein said minor loops and said major loop are constructed of magnetic bubble transfer circuits on a magnetic sheet, and the data are stored by exploiting a state of existence of magnetic bubbles.

* * * * *

Notice of Adverse Decision in Interference

In Interference No. 100,438, involving Patent No. 4,133,043, M. Hiroshima, S. Yoshizawa, N. Saito, A. Asano, H. Suehiro, M. Saitoh and K. Mise, SHIFT REGISTER TYPE MEMORY, final judgment adverse to the patentees was rendered Apr. 27, 1983, as to claims 1-4 and 11.

[*Official Gazette November 15, 1983.*]